United States Patent [19]

Nozawa et al.

[11] Patent Number: 5,221,403
[45] Date of Patent: Jun. 22, 1993

[54] SUPPORT TABLE FOR PLATE-LIKE BODY AND PROCESSING APPARATUS USING THE TABLE

[75] Inventors: Toshihisa Nozawa, Yokohama; Junichi Arami, Hachioji; Isahiro Hasegawa, Zushi; Haruo Okano, Tokyo, all of Japan

[73] Assignees: Tokyo Electron Limited, Tokyo; Kabushiki Kaisha Toshiba, Kawasaki, both of Japan

[21] Appl. No.: 732,410

[22] Filed: Jul. 18, 1991

[30] Foreign Application Priority Data

Jul. 20, 1990 [JP] Japan ................... 2-192461

[51] Int. Cl.[5] ............... H01L 21/306; B44C 1/22
[52] U.S. Cl. ...................... 156/345; 118/724; 156/643; 204/298.37
[58] Field of Search ............. 156/345, 643, 646; 204/298.37; 118/723, 724, 725, 728

[56] References Cited

U.S. PATENT DOCUMENTS 4,878,995  11/1989  Arikado et al. .............. 156/345 X
4,956,043   9/1990  Kanetomo et al. ............ 156/345

FOREIGN PATENT DOCUMENTS 61-79769   4/1986  Japan .
63-56920   3/1988  Japan .................... 156/345
0131520    6/1988  Japan .................... 156/345
0131521    6/1988  Japan .................... 156/345
1-177368   7/1989  Japan .
0200625    8/1989  Japan .................... 156/345
1-251735  10/1989  Japan .

Primary Examiner—William A. Powell
Attorney, Agent, or Firm—Oblon, Spivak, McClelland, Maier & Neustadt

[57] ABSTRACT

A wafer support table is provided in a vacuum chamber of a magnetron plasma etching apparatus. This support table includes a first member having a mechanism for adjusting the temperature of a wafer, a second member having an electrostatic chuck for supporting the wafer on its upper surface, and a gas supply mechanism for supplying a gas between the first and second members.

20 Claims, 3 Drawing Sheets

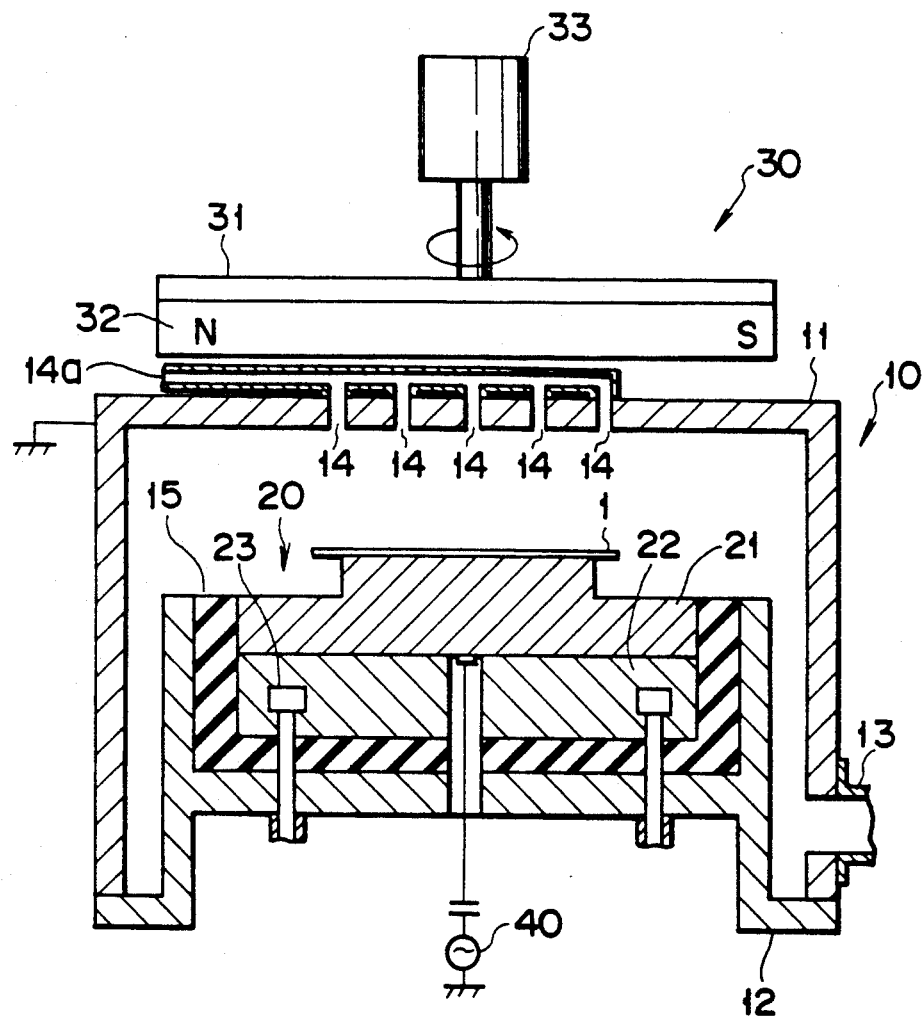
F I G. 1

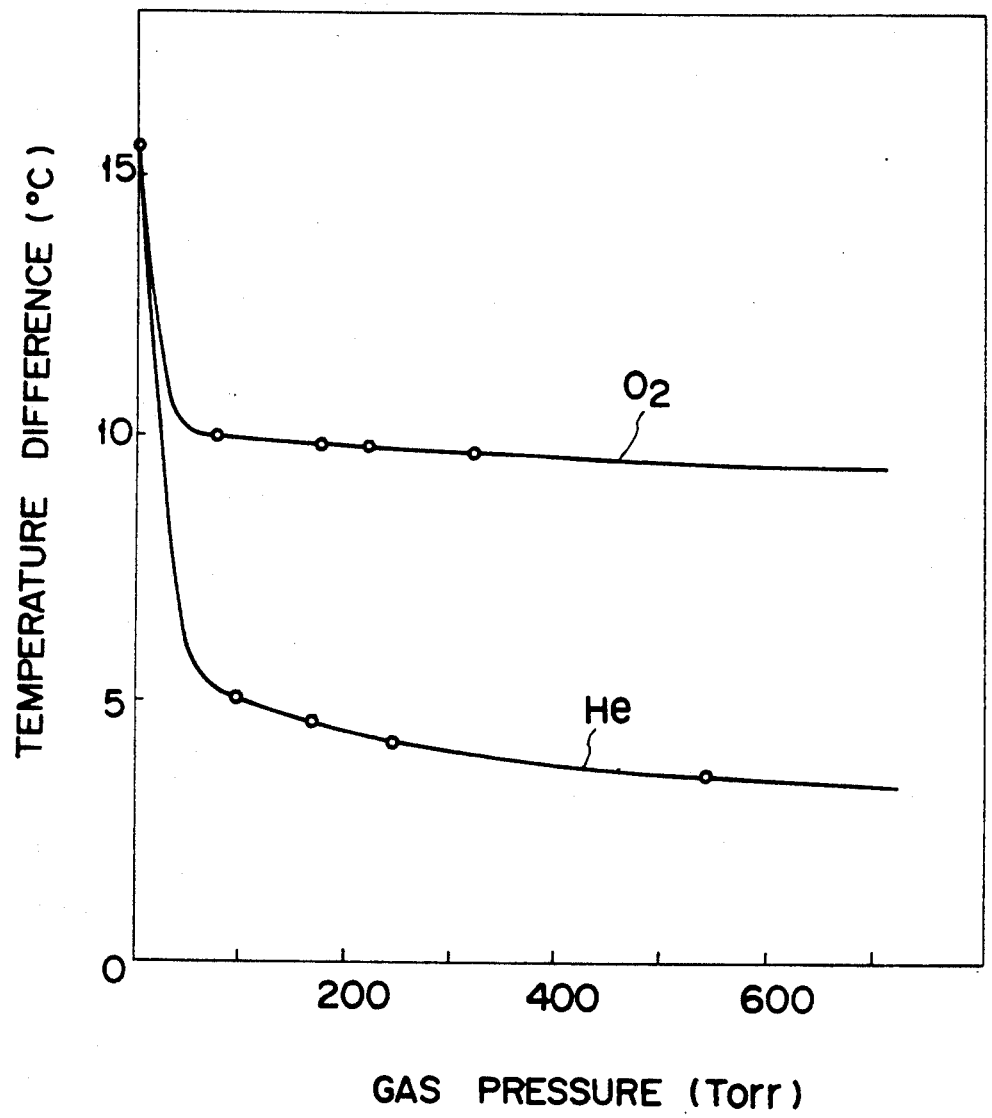
F I G. 5

SUPPORT TABLE FOR PLATE-LIKE BODY AND PROCESSING APPARATUS USING THE TABLE

BACKGROUND OF THE INVENTION

1. Field of the Invention

The present invention relates to a support table for supporting a plate-like body such as a wafer in a vacuum apparatus, for example, a plasma etching apparatus, and a processing apparatus using the table.

2. Description of the Related Art

In a plasma etching apparatus, a support table called a "susceptor" is used to support a wafer. Since the temperature of the wafer is increased by a plasma during etching, the susceptor incorporates a temperature adjusting mechanism for cooling the wafer at a predetermined temperature. The susceptor acts as a lower electrode of the plasma etching apparatus.

In recent years, since the diameter of wafers become large and the kind of diameters of wafers are increased in accordance with increasing bypass of wafers, susceptors corresponding to the respective wafer sizes must be provided. Published Unexamined Japanese Patent Application No. 59-115521 discloses an apparatus which can use susceptors corresponding to various types of wafers.

In addition, since damage is caused on the surface of a wafer support table for use in, for example, plasma etching, the support table must be replaced as a consumable. If the support table has, e.g., for example, an electrostatic chuck sheet, the electrostatic chuck must also be replaced.

For the above reasons, a demand has arisen for a support table which can be split into two portions, that is, a stationary portion and a removable portion so that replacement can be performed by only removing the removable portion in accordance with the size of a wafer or when the surface is damaged. That is, when the support table is split into two portions, while the stationary portion having a temperature adjusting function is constantly set, a plurality of types of removable portions can be prepared in accordance with the sizes of wafers, thereby processing wafers of various sizes. In addition, since only the removable portion need be removed in the replacement of the support table surface or the electrostatic chuck, the replacement can be easily performed.

When the above split structure is adopted in the support table, however, since the removable portion and the stationary portion are always joined with each other with a gap formed therebetween or dust sandwiched therebetween, a heat conduction characteristic between the stationary and removable portions is degraded. Therefore, the temperature of an object to be processed cannot be efficiently adjusted. Especially when the support table is used in a vacuum processing apparatus such as an etching apparatus, a portion defined between the stationary and removable portions is in a vacuum state. Therefore, no heat conduction is caused by a gas, but only solid contact heat conduction near boltfastened portions between the two portions can be expected. In this case, since the bolt connection portion is present in a peripheral portion of the support table, no effective heat conduction can be expected in a central portion of the table. Therefore, it is very difficult to perform uniform temperature adjustment of a wafer.

SUMMARY OF THE INVENTION

The present invention has been made in consideration of the above situation and has as its object to provide a split-type supporting table for a plate-like body, which can effectively adjust the temperature of an object to be processed supported thereon.

It is another object of the present invention to provide a vacuum processing apparatus using the supporting apparatus.

It is still another object to provide a split-type electrode which can effectively adjust its temperature.

The present invention provides a support table for supporting a plate-like member, comprising:

a first member having a mechanism for adjusting a temperature of the object to be processed;

a second member, for supporting the plate-like member, provided in contact with the first member; and gas supply means for supplying a heat conduction gas between the first and second members.

In addition, the present invention provides a processing apparatus for performing predetermined processing for an object to be processed in a vacuum atmosphere, comprising:

a vacuum chamber held at a predetermined vacuum degree;

a support table provided in the vacuum chamber and having a first member having a mechanism for adjusting a temperature of the object to be processed, a second member, for supporting the object, provided in contact with the first member, and gas supply means for supplying a gas between the first and second members; and processing means for performing arbitrary processing for the object to be processed.

Further, the present invention provides an electrode used in a vacuum atmosphere comprising:

a first member having a mechanism for adjusting a temperature of the electrode;

a second member removably set in contact with the first member; and gas supply means for supplying a gas between the first and second members.

According to the present invention, when the support table or electrode is of a split type, a gas can be supplied between the first and second members. Therefore, since heat conduction between the two members can be efficiently performed by the gas, a temperature can be controlled with high precision.

Additional objects and advantages of the invention will be set forth in the description which follows, and in part will be obvious from the description, or may be learned by practice of the invention. The objects and advantages of the invention ma be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing an arrangement of a magnetron plasma etching apparatus using a support table according to an embodiment of the present invention;

FIG. 5 is a graph for explaining an effect of the heat conduction gas.

DETAILED DESCRIPTION OF THE PREFERRED EMBODIMENTS

Figure 2:
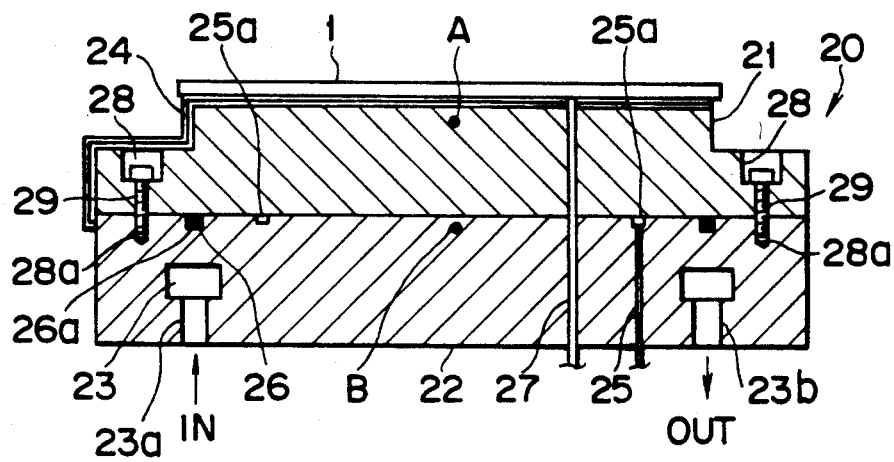
FIG. 2 is a sectional view showing the support table used in the apparatus shown in FIG. 1 in detail.

An embodiment in which the present invention is applied to a support table of an electrostatic chuck type for use in a plasma etching apparatus will be described below.

FIG. 1 is a schematic view showing an arrangement of a magnetron plasma etching apparatus using a support table according to the embodiment of the present invention. This apparatus comprises a vacuum chamber 10, an upper wall of which acts as second electrode, a support table 20, acting as a first electrode, for supporting a wafer 1 provided in the chamber 10, a magnet section 30 above the chamber 10, and an RF power supply 40.

The vacuum chamber 10 has upper and lower chambers 11 and 12. An exhaust port 13 is formed in the lower side wall of the upper chamber 11, and the vacuum chamber 10 is evacuated by an exhaust pump (not shown) connected to the exhaust port 13. The apparatus is designed so that the vacuum chamber 10 is evacuated to be about $10^{-6}$ Torr. A plurality of gas inlet ports 14 for supplying an etching gas are formed in the upper wall of the upper chamber 11. A gas supply pipe 14a for supplying the etching gas from a gas supply source (not shown) is connected to the inlet ports 14.

Since the support table 20 is arranged on the lower chamber 12 via an electrically insulating ceramic member 15, the lower chamber 12 and the support table 20 are electrically insulated from each other. The support table 20 has an upper member 21 having a wafer support portion and a lower member 22 including a liquid passage 23 for performing temperature adjustment for a wafer. The structure of the support table 20 will be described in detail later.

The RF power source 40 is connected to the upper member 21 of the support table 20, and the upper chamber 11 is grounded. Therefore, when RF power is supplied to between the supporting table 20 and the chamber 10, the upper wall of the upper chamber 11 acts as an upper electrode, and the upper member 21 acts as a lower electrode, thereby generating a plasma therebetween.

The magnet section 30 applies a magnetic field between the electrodes in the direction perpendicular to the electric field therebetween. The section 30 has a horizontally set support member 31, a permanent magnet 32 supported by the support member 31, and a motor 33 for rotating these members in a direction indicated by an arrow in FIG. 1.

In the magnetron plasma etching apparatus having the above arrangement, an etching gas is supplied to the chamber 10, and RF power is applied between the upper and lower electrodes, while a magnetic field is applied between the electrodes by the rotating permanent magnet 32. Therefore, electrons present between the electrodes perform cyclone motion to collide against molecules by crossed field, thereby increasing the number of times of ionization of the molecules. As a result, a high etching rate of 1 μm/min. can be obtained even at a comparatively low pressure of $10^{-2}$ to $10^{-3}$ Torr. Therefore, processing can be completed within a short time period per wafer and reliability of etching is improved. In addition, since an average energy of ions is decreased, a wafer is damaged less.

The support table 20 for a wafer as an object to be processed will be described in detail below. FIG. 2 is a sectional view showing the support table 20 in detail. The support table 20 has the upper and lower members 21 and 22 as described above, and an electrostatic chuck 24 for chucking a wafer by an electrostatic force (Coulomb force) is arranged on the upper surface of the upper member 21. The chuck 24 generates electrostatic chucking force when the wafer 1 is conducted via a plasma by plasma generation. While the lower member 22 is stationary, the upper member 21 and the electrostatic chuck 24 are replaceable.

The upper member 21 is a disk member having a step portion on its peripheral portion, and the lower member 22 is a simple disk member. Bolt insertion holes 28 are formed with equal intervals therebetween in the peripheral portion of the upper member 21 along its circumference. Screw holes 28a are formed in the lower member 22 at positions corresponding to the bolt insertion holes 28. Bolts 29 are inserted in the insertion holes 28 to fasten the upper member 21 on the lower member 22. By removing the bolts 29, the upper member 21 can be removed from the lower member 22.

Figure 3:
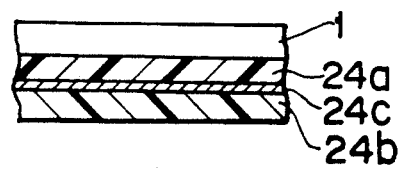
FIG. 3 is a sectional view showing an electrostatic chuck for supporting a wafer for use in the support table of the apparatus shown in FIG. 1.

As shown in FIG. 3, the electrostatic chuck 24 is constituted by two insulating sheets (for example, polyimide sheets) 24a and 24b and an electrically conductive sheet 24c formed between the insulating sheets 24a and 24b and consisting of, for example, copper. After the wafer 1 is mounted on the electrostatic chuck 24, a high voltage is applied between the wafer 1 and the electrically conductive sheet 24c from a power supply (not shown) via a plasma, thereby chucking the wafer 1 by a Coulomb force. The upper member 21 and the wafer are electrically insulated from each other by the electrostatic chuck 24.

The lower member 22 has the annular liquid passage 23 as described above, and liquid inlet and outlet passages 23a and 23b are connected to the liquid passage 23. The temperature of the wafer 1 is adjusted by supplying a liquid at a predetermined temperature to the liquid passage 23 at a proper flow rate. The temperature of the liquid is arbitrarily set in accordance with the type of wafer to be processed. That is, if it is difficult to perform predetermined etching because an unnecessary reaction except for an etching chemical reaction is caused by the heat of a plasma during the etching operation, a cooling medium such as an anti-freeze at a temperature of, e.g., −25° C. is circulated in the liquid passage 23 to hold the wafer temperature at about −15° C. On the other hand, a preferable temperature of the wafer 1 is sometimes about 70° C. to 80° C. in accordance with the type of etching processing. In this case, a heating medium such as hot water is circulated in the liquid passage 23 to control the temperature of the wafer 1.

An O-ring groove 26a is formed in a peripheral portion on the upper surface of the lower member 22 along its circumference, and a gas filling ring groove 25a is formed inside the O-ring groove 26a along the circumference of the lower member 22. A gas inlet passage 25 is connected to the groove 25a, and a heat conduction gas is supplied from a gas supply source (not shown) to the groove 25a via a control mechanism (to be described later) and the inlet passage 25, thereby filling the gas between the upper and lower members 21 and 22. An O-ring 26 is fitted in the O-ring groove 26a to prevent a leakage of the heat conduction gas from between the upper and lower members 21 and 22. However the heat conduction gas may leak a little.

Figure 4:
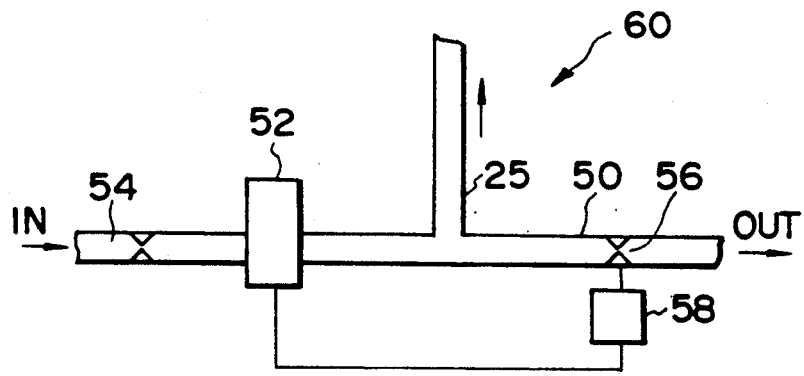
FIG. 4 is a schematic view showing a mechanism for controlling the pressure of a heat conduction gas.

The pressure of the heat conduction gas between the upper and lower members 21 and 22 is controlled by a mechanism 60 as shown in FIG. 4. In the mechanism 60, the gas inlet passage 25 extends upward from an intermediate portion of a gas supply pipe 50. A regulator 52 and a throttle valve 54 are arranged on the IN side of the gas supply pipe 50, and a throttle valve 56 is arranged on its OUT side. A gauge pressure measured by the regulator 52 is fed back to a valve drive unit 58 for driving the throttle valve 56 on the OUT side, and opening/closing of the valve 56 on the OUT side is controlled such that the measured gauge pressure is maintained constant. Alternatively, an operator may adjust the valve while monitoring the gauge pressure without using the valve drive unit 58.

In a conventional support table in which no heat conduction gas is flowed, a gap is formed between the upper and lower members 21 and 22 due to, for example, a difference of smoothnesses, a surface roughness, or dust therebetween. If the temperature adjustment is performed on the lower member 22 side while the gap is formed as described above, almost no heat conduction is caused by a gas between the upper and lower members 21 and 22 because the vacuum chamber is evacuated, but only solid contact heat conduction around the bolts 29 fastening the two members can be expected.

On the contrary, when a heat conduction gas is held at a predetermined pressure between the upper and lower members 21 and 22 as in the present invention, a heat conduction characteristic between the two members can be improved. Therefore, the temperature of a wafer as an object to be processed can be efficiently adjusted.

Although the type of gas used as the heat conduction gas is not particularly limited, a gas having a high heat conductivity is preferred for its purpose. Preferable examples of the gas are He, 02, Ar, and N2, and He is most preferred.

When the pressure of the heat conduction gas is at a predetermined value or more, the effect of the gas can be obtained. For this reason, the gas pressure is controlled as described above. When the gas pressure is at a predetermined value or more, heat conduction caused by the gas does not depend much on the gas pressure but depends largely on a gap distance between the upper and lower members 21 and 22. That is, the effect of the heat conduction gas is enhanced as the gap between the two members is decreased. Therefore, when the gap between the two members is minimized, heat conduction caused by the gas can be improved to realize highly precise temperature control. The gap distance can be decreased to be 10 $\mu$m or less by finishing the mating surfaces of the two members with high precision. As a result, heat is conducted at a high efficiency to realize highly precise temperature control.

FIG. 5 shows the effect of the heat conduction gas. FIG. 5 is a graph showing a relationship between the pressure of the heat conduction gas between the upper and lower members 21 and 22 and the temperature difference between the upper and lower members obtained when He and $O_2$ were used as heat conduction gases, in which the abscissa indicates the gas pressure and the ordinate indicates the temperature difference. The temperature difference shown in FIG. 5 was obtained between a temperature measured at a point A of the upper member 21 and that at a point B of the lower member 22 shown in FIG. 2. An anti-freeze at a temperature of $-25°$ C. was used as a coolant to be flowed through the lower member. The pressure in the chamber 10 was set at $3.5 \times 10^{-3}$ Torr.

As shown in FIG. 5, a temperature difference of 15° C. or more obtained before supply of a gas was reduced regardless of the type of gas. In addition, the temperature reducing effect was saturated at a gas pressure of 150 Torr. The temperature reducing effect changes in accordance with the type of gas. That is, while the temperature difference was reduced to be at most about 10° C. when 2 gas was used, it was reduced to be about 4° C. when He gas was used.

A heat conduction gas was supplied between the wafer 1 and the electrostatic chuck 24 from a gas inlet passage 27 to further improve the temperature control precision of the wafer 1. Although the type of gas is not particularly limited, He, $O_2$, Ar, $N_2$, and the like can be preferably used as is the case with the above heat conduction gas.

An operation of the magnetron etching apparatus having the above arrangement will be described below.

Firstly, the chamber 10 is evacuated to predetermined degree of vacuum. Thereafter, a wafer to be etched is supplied on the electrostatic chuck sheet 24 from load lock chamber (not shown) by a robot, and a high voltage of electrostatic voltage of, for example 2 kV is applied between the upper chamber 11 and the electrically conductive sheet 24c of the electrostatic chuck 24. When a plasma is generated by a step to be described later, since wafer 1 is conducted via the plasma, static electricity is generated on chuck 24 and wafer 1 is chucked on the electrostatic chuck 24 by a Coulomb force.

Subsequently, the vacuum chamber 10 is evacuated to be about 0.1 m Torr to 10 m Torr, and an etching gas such as $O_2$ gas, Cl gas, or SF6 gas is supplied from the gas inlet ports 14 at a flow rate of 50 cc/s (at room temperature and atmospheric pressure). RF power is supplied between the upper wall of the upper chamber 11 as an upper electrode and the upper member 21 as the lower electrode from the RF power source 40, thereby generating a magnetron discharge by crossed field formed between the two electrodes and forming a plasma between the two electrodes. As a result, radicals and ions are generated to cause reactive ion etching on the surface of the wafer 1. In this etching, since electrons between the electrodes are caused to perform cyclone motion by the magnetic force from the permanent magnet 32 as described above, plasma conversion of the etching gas is accelerated. Therefore, a high etching rate of 1 $\mu$m/min can be obtained even at a comparatively low pressure of $10^{-2}$ to $10^{-3}$ Torr.

In this case, since a heat conduction gas is supplied between the upper and lower members 21 and 22 of the support table 20 to improve the heat conduction characteristic between the members 21 and 22, a temperature difference between the two members can be minimized. Therefore, temperature control of the wafer can be reliably performed by flowing a liquid for temperature control through the liquid passage 23 of the lower member 22. As a result, regardless of the split structure of the support table, the wafer temperature control can be performed substantially equally as in a support table of a single unit type.

In addition, since the support table 20 is of a split type in which the upper member 21 can be removed from the stationary lower member 22, only the upper member 21 need be replaced when the inch size of the wafer 1 is changed. Also, in replacement of the electrostatic chuck 24 as a consumable, the upper member 21 having a new electrostatic chuck need only be replaced.

In the above embodiment, an upper wall of vacuum chamber 10 is acted as a second electrode, the second electrode may be provide isolating from the chamber 10.

The support table according to the present invention is applied to a magnetron plasma etching apparatus. However, the present invention can be similarly applied to any vacuum processing apparatus without departing from the spirit and scope of the invention. Examples of the vacuum processing apparatus are, in addition to the magnetron plasma etching apparatus described above an RIE plasma etching apparatus, other plasma processing apparatuses such as a sputtering apparatus, a CVD apparatus, and an ion injection apparatus, and non-plasma processing apparatuses such as a thermal CVD apparatus. The present invention can also be applied to vacuum apparatuses for use in various other fields. In addition, the present invention can be applied to the apparatus including an electrode, temperature of which is controlled. Such apparatus include ion source apparatus and above-mentioned apparatus, the support table or the electrode can be controlled at either a high or low temperature. A plate-like body is not limited to a semiconductor wafer but may be, for example an LCD substrate.

Furthermore, as the gas to be supplied between the upper and lower members, various types of gases capable of improving heat conduction characteristic can be used in accordance with the type of process.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

We claim:

1. A processing apparatus for performing predetermined processing for an object to be processed in a vacuum atmosphere, comprising:
   a vacuum chamber held at a predetermined vacuum degree;
   a support table provided in said vacuum chamber and including a first member having a mechanism for adjusting a temperature of said object by means of a temperature adjusting medium contained therein, and a second member, for supporting said object, detachably provided on said first member;
   gas supply means for supplying a heat-conduction gas between said first and second members; and
   processing means for performing arbitrary processing for said object.

2. An apparatus according to claim 1, wherein said processing means includes plasma generating means and performs predetermined processing by a generated plasma.

3. An apparatus according to claim 1, wherein said second member includes an electrostatic chuck for holding said object by coulomb force.

4. An apparatus according to claim 3, further comprising gas supply means for supplying a heat conduction gas between said electrostatic chuck and said object.

5. A plasma etching apparatus for dry-etching a semiconductor wafer, comprising:
   a vacuum chamber held at a predetermined vacuum degree;
   a support table provided in said vacuum chamber and including a first member having a mechanism for adjusting a temperature of said wafer by means of a temperature adjusting medium contained therein, and a second member, for supporting said wafer, detachably provided on said first member;
   gas supply means for supplying a heat-conduction gas between said first and second members;
   plasma generating means for generating a plasma for an etching gas around said wafer; and
   magnetic field applying means for applying a magnetic field to a region where the plasma is generated.

6. A support table apparatus for supporting an object to be processed provided in a processing apparatus for processing said object in a vacuum atmosphere, comprising:
   a support table including a first member having a mechanism for adjusting a temperature of said object by means of a temperature adjusting medium contained therein and, a second member, for supporting said object, detachably provided on said first member; and
   gas supply means for supplying a heat conduction gas between said first and second members.

7. A table according to claim 6, wherein said second member includes an electrostatic chuck for holding said body by a Coulomb force.

8. A table according to claim 6, wherein said first member is fixed to said processing apparatus, and said second member can be removed therefrom.

9. A table according to claim 6, wherein said gas supply means includes a gas inlet passage for supplying the heat conduction gas between said first and second members.

10. A table according to claim 9, wherein said gas supply means has a gas pressure control mechanism for controlling a gas pressure between said first and second members.

11. A table according to claim 6, wherein the heat conduction gas is one member selected from the group consisting of He, $O_2$, Ar, and $N_2$.

12. A table according to claim 6, wherein said mechanism for adjusting a temperature includes a temperature adjusting liquid passage formed in said first member.

13. A table according to claim 6, wherein said mechanism for adjusting a temperature includes a mechanism for cooling said object to be processed.

14. A table according to claim 6, wherein said mechanism for adjusting a temperature includes a mechanism for heating said object to be processed.

15. A table according to claim 7, further comprising gas supply means for supplying a heat conduction gas between said electrostatic check and said body.

16. A plasma etching apparatus for dry-etching a semiconductor wafer, comprising:

a vacuum chamber held at a predetermined vacuum degree;

a support table provided in said vacuum chamber and including a first member having a mechanism for adjusting a temperature by means of a temperature adjusting medium contained therein, and a second member detachably provided on said first member having an electrostatic chuck thereon for holding said object by coulomb force;

first gas supply means for supplying a heat-conduction gas between said first and second members;

second gas supply means for supplying a heat-conduction gas between said electrostatic chuck and said wafer; and plasma generating means for generating a plasma of an etching gas around said wafer.

17. A support table according to claim 6, further comprising an O-ring for preventing a leakage of the heat-conduction gas, provided between said first and second members.

18. A support table according to claim 6, further comprising bolts for fastening said second member to said first member.

19. A plasma etching apparatus according to claim 5, further comprising magnetic field applying means for applying a magnetic field to a region where the plasma is generated.

20. A plasma etching apparatus according to claim 16, further comprising magnetic field applying means for applying a magnetic field to a region where the plasma is generated.

* * * * *